(12) United States Patent
Lee et al.

(10) Patent No.: US 9,798,664 B2
(45) Date of Patent: Oct. 24, 2017

(54) METHOD AND APPARATUS FOR CORRECTING CACHE PROFILING INFORMATION IN MULTI-PASS SIMULATOR

(71) Applicant: SAMSUNG ELECTRONICS CO., LTD., Suwon-si (KR)

(72) Inventors: Jin-seok Lee, Seoul (KR); Tai-song Jin, Seoul (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/032,867

(22) PCT Filed: Mar. 12, 2014

(86) PCT No.: PCT/KR2014/002034
§ 371 (c)(1),
(2) Date: Apr. 28, 2016

(87) PCT Pub. No.: WO2015/064856
PCT Pub. Date: May 7, 2015

(65) Prior Publication Data
US 2016/0253261 A1    Sep. 1, 2016

(30) Foreign Application Priority Data
Oct. 28, 2013  (KR) .......................... 10-2013-0128654

(51) Int. Cl.
*G06F 17/50* (2006.01)
*G06F 12/0815* (2016.01)
(Continued)

(52) U.S. Cl.
CPC ........ *G06F 12/0815* (2013.01); *G06F 11/261* (2013.01); *G06F 11/3409* (2013.01);
(Continued)

(58) Field of Classification Search
None
See application file for complete search history.

(56) References Cited

U.S. PATENT DOCUMENTS 6,772,106 B1 * 8/2004 Mahlke .................. G06F 8/447
                                                                703/21
6,983,234 B1    1/2006 Hangal et al.
(Continued)

OTHER PUBLICATIONS

Sasa Tomic, et al; "Rapid Development of Error-Free Architectural Simulators using Dynamic Runtime Testing"; In Computer Architecture and High Performance Computing; 2011 23rd International Symposium; Oct. 26-29, 2011; 9 pgs. total.
(Continued)

*Primary Examiner* — Kaushikkumar Patel
(74) *Attorney, Agent, or Firm* — Sughrue Mion, PLLC

(57) ABSTRACT

Provided method includes storing a first cache snap shot including cache profiling information regarding a cache when a first process being executed by a cycle accurate simulator is terminated; storing a second cache snap shot including the cache profiling information on the cache when a second process is executed in the cycle accurate simulator; comparing the second cache snap shot of the second process and the first cache snap shot of the first process to readjust any one value of a cache hit value and a cache miss value which are present in the second cache snap shot of the second process; and correcting the cache profiling information which is stored in the first cache snap shot of the first process by reflecting the readjusted any one value of the cache hit value and the cache miss value present in the second cache snap shot of the second process.

18 Claims, 6 Drawing Sheets

(51) Int. Cl.
*G06F 11/26* (2006.01)
*G06F 11/34* (2006.01)

(52) U.S. Cl.
CPC ...... *G06F 11/3466* (2013.01); *G06F 17/5022* (2013.01); *G06F 11/3485* (2013.01); *G06F 2201/885* (2013.01); *G06F 2212/1032* (2013.01)

(56) References Cited

U.S. PATENT DOCUMENTS

| | | |
|---|---|---|
| 2002/0072893 A1 | 6/2002 | Wilson |
| 2004/0193395 A1 | 9/2004 | Paulraj |
| 2006/0155525 A1* | 7/2006 | Aguilar, Jr. ......... G06F 17/5022 703/26 |
| 2007/0192079 A1* | 8/2007 | Rompaey ............ G06F 11/3457 703/19 |
| 2013/0013283 A1 | 1/2013 | Gam |
| 2013/0346046 A1* | 12/2013 | Rompaey ............ G06F 17/5031 703/6 |

OTHER PUBLICATIONS

International Search Report and Written Opinion dated Jul. 28, 2014, issued by the International Searching Authority in International Application No. PCT/KR2014/002034 (PCT/ISA/220, PCT/ISA/210 & PCT/ISA/237).

\* cited by examiner

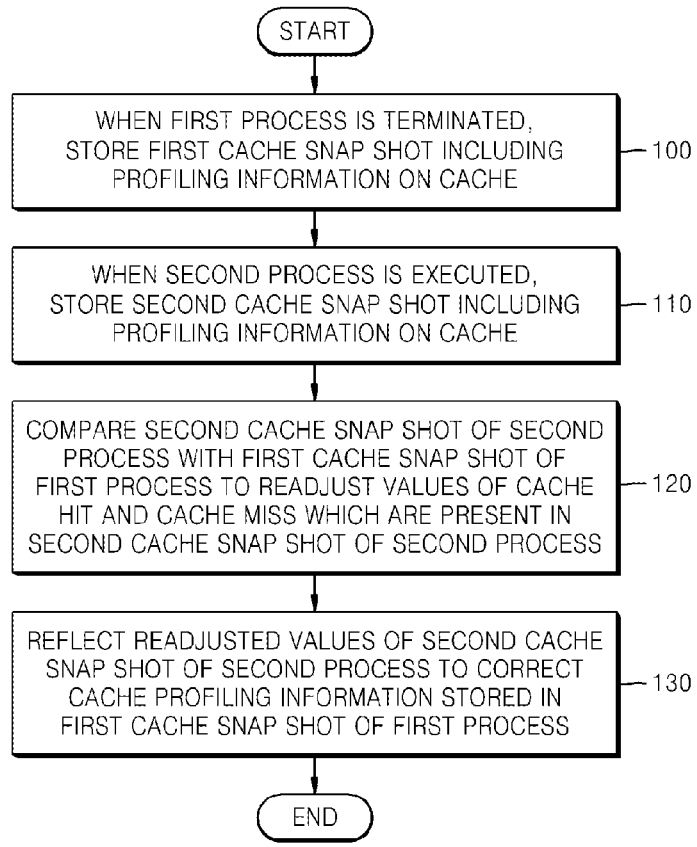
[Fig. 1]
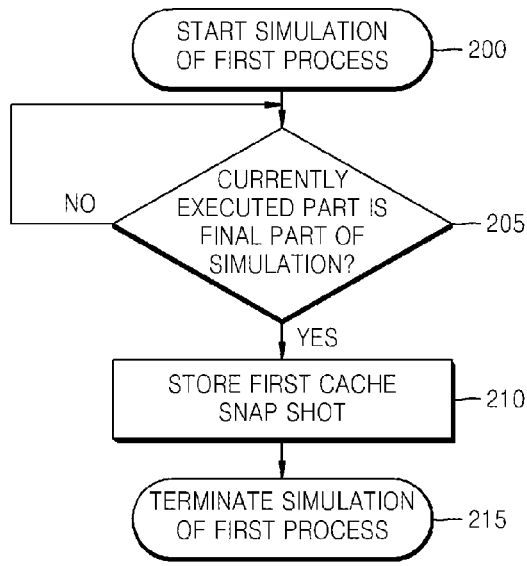
[Fig. 2a]

[Fig. 2b]
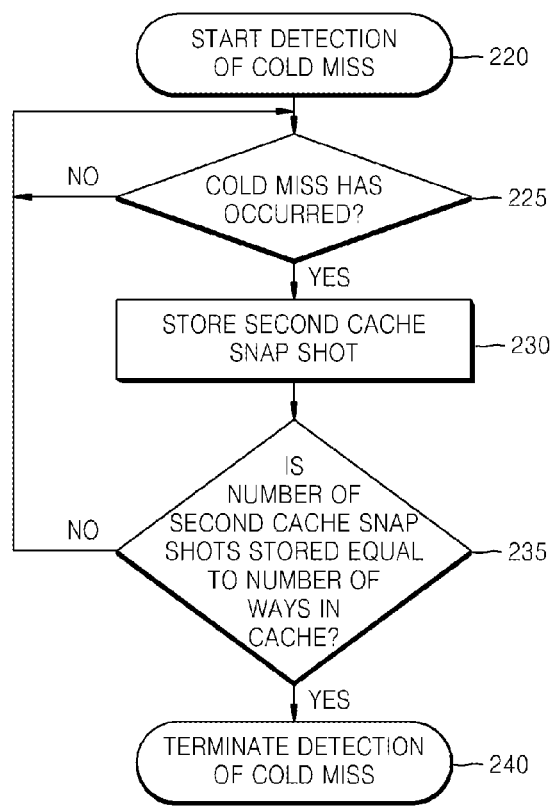
[Fig. 2c]
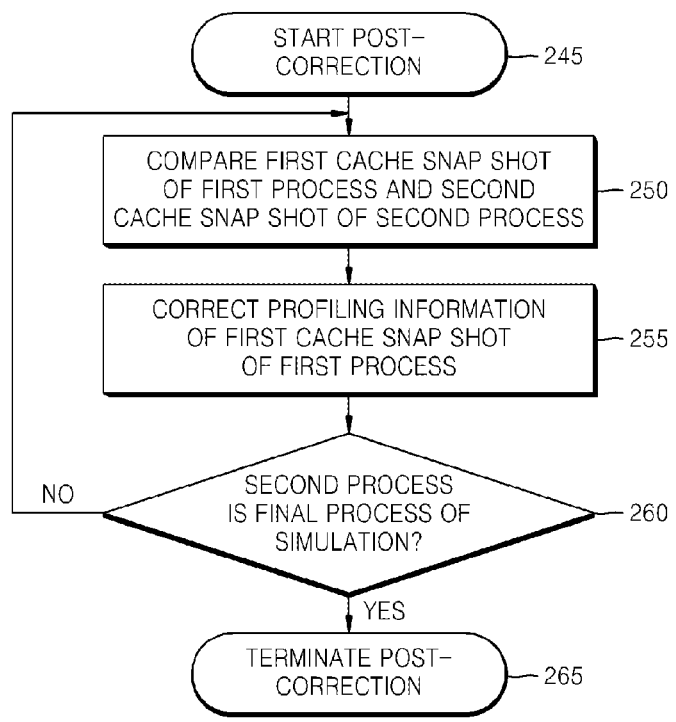

[Fig. 3]
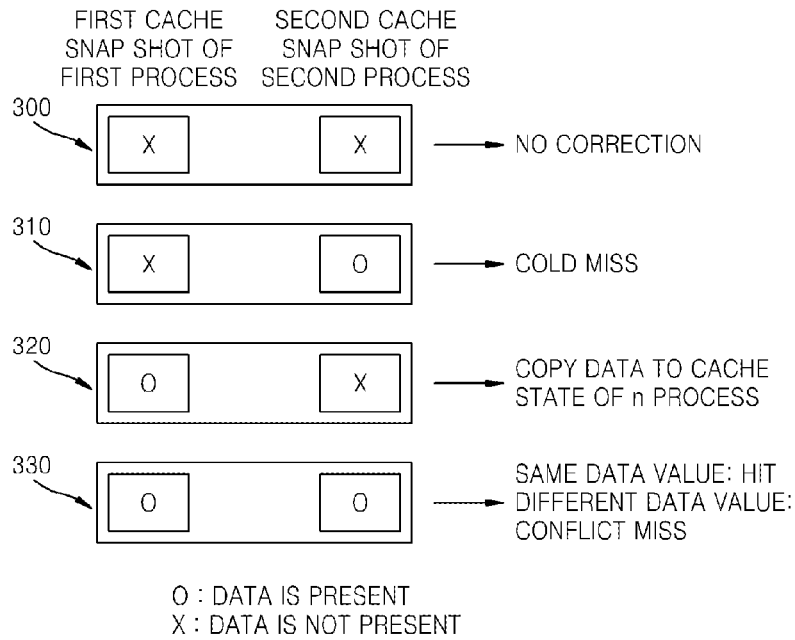
[Fig. 4a]
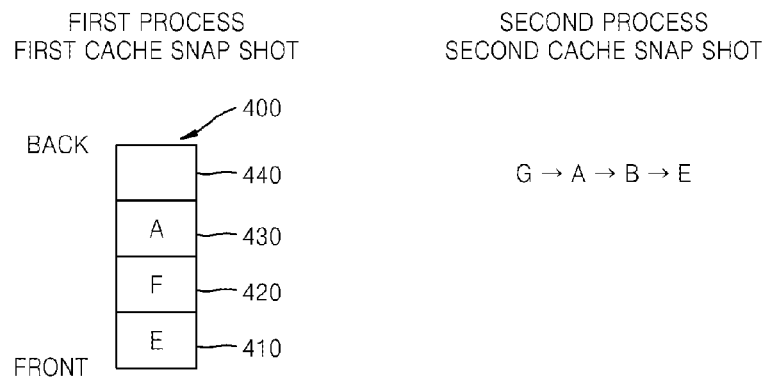
[Fig. 4b]
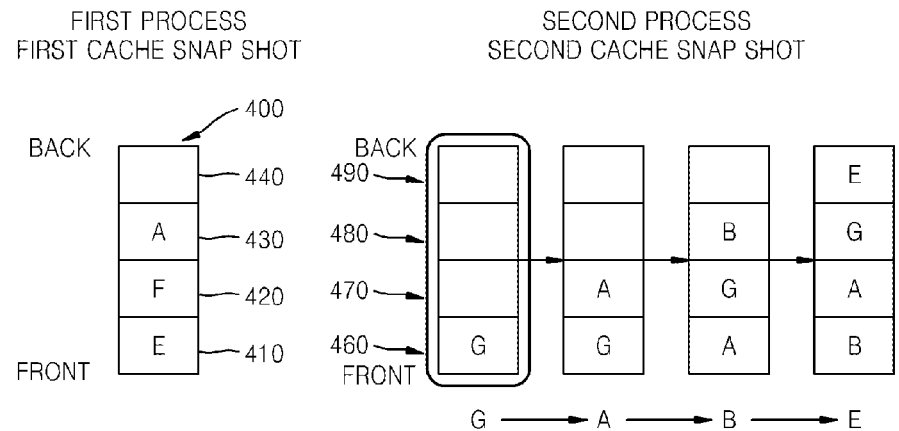

[Fig. 4c]
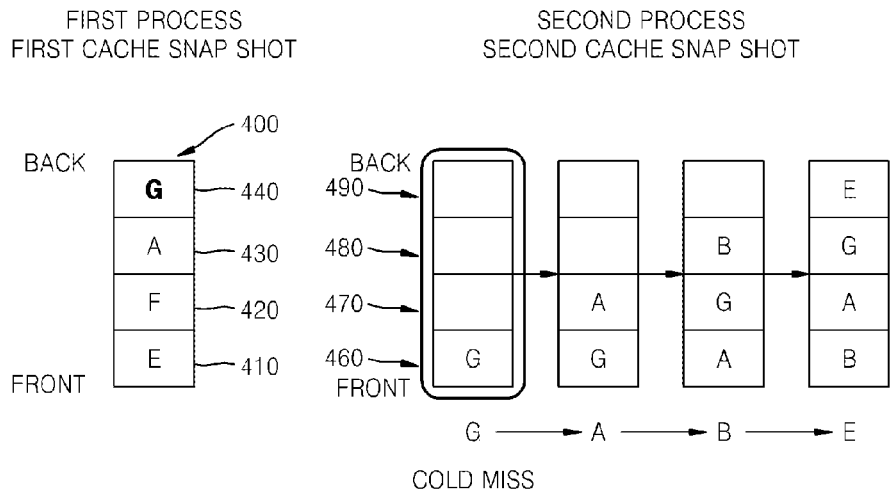
[Fig. 4d]
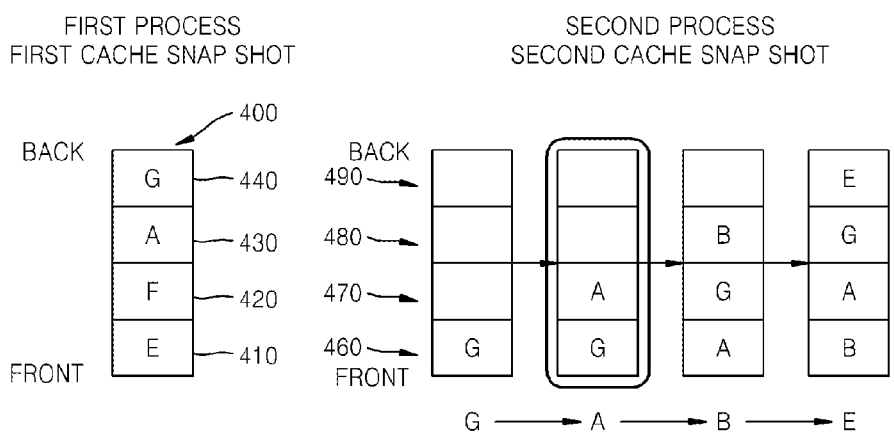
[Fig. 4e]
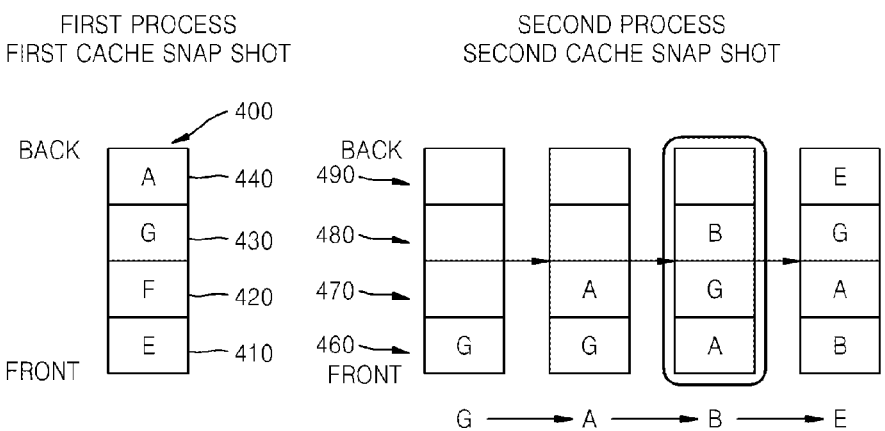

[Fig. 4f]
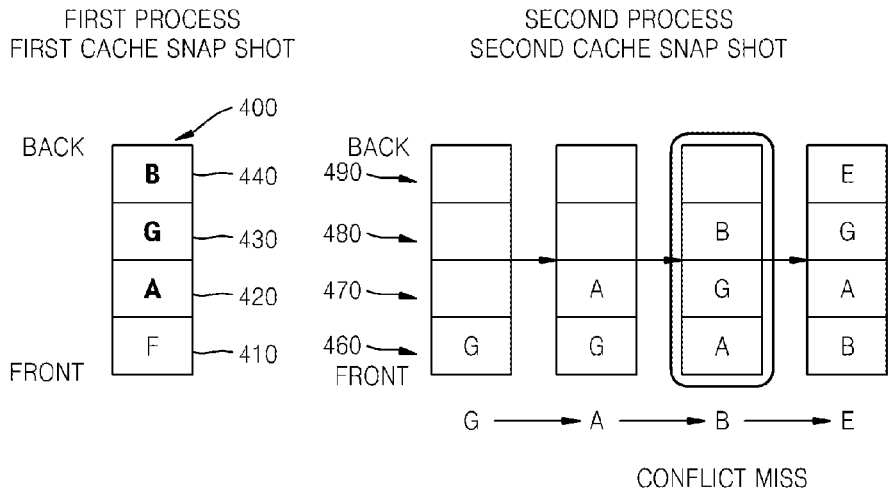
[Fig. 4g]
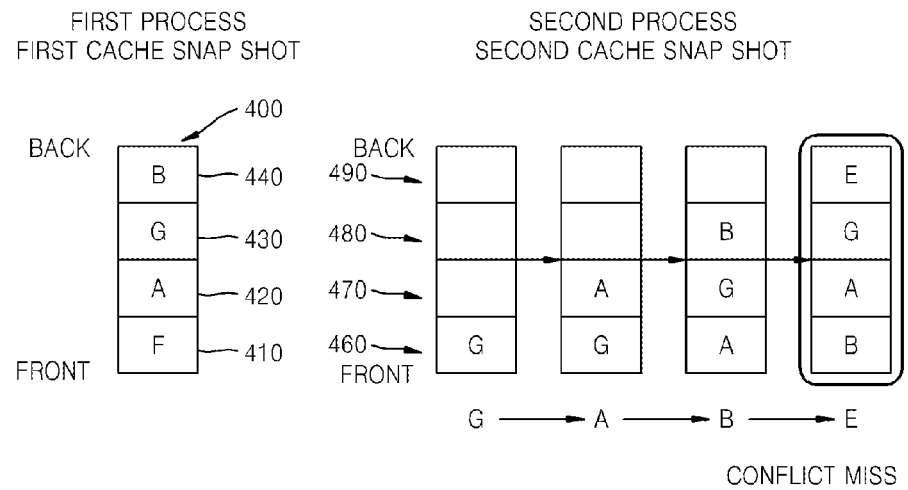
[Fig. 4h]
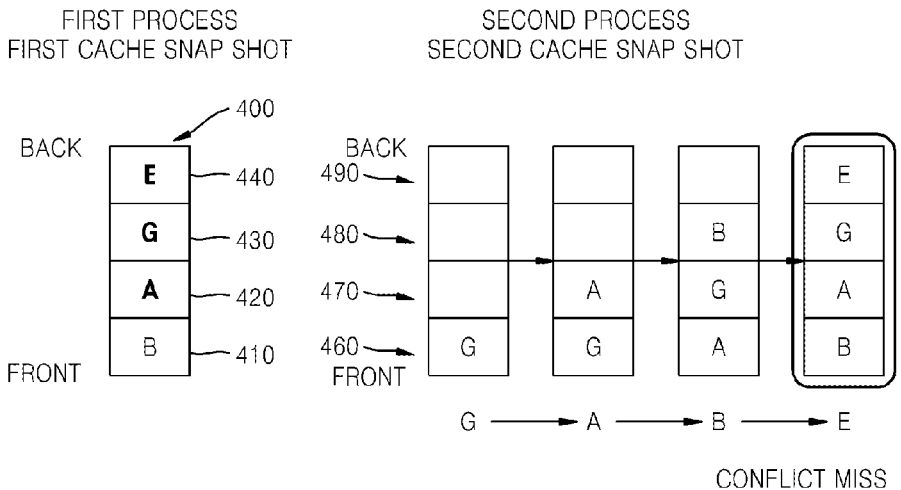

[Fig. 5]
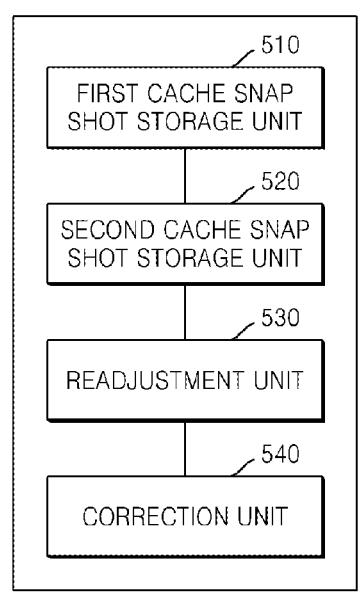

METHOD AND APPARATUS FOR CORRECTING CACHE PROFILING INFORMATION IN MULTI-PASS SIMULATOR

This is a National Stage Entry of International Application No. PCT/KR2014/002034 filed Mar. 12, 2014, which claims priority from Korean Patent Application No. 10-2013-0128654 filed Oct. 28, 2013, the contents of all of which are incorporated herein by reference in their entirety.

TECHNICAL FIELD

One or more embodiments of the present invention relate to a method and apparatus for correcting cache profiling information in a multi-pass simulator, and more particularly, to a method and apparatus for correcting cache profiling information in a cycle accurate simulator within a multi-pass simulator.

BACKGROUND ART

Architects use a simulator in order to verify and evaluate a design before developing a system. Since software developers are required to develop an application before hardware is developed, a simulator is necessary. However, simulators have a considerably low execution speed in comparison to hardware. Nevertheless, simulators have been widely used by developers because of the convenience which simulators provide for developing an application before developing hardware.

DISCLOSURE OF INVENTION

Technical Problem

Simulators have a considerably low execution speed in comparison to hardware.

Solution to Problem

Embodiments of the present invention provide correcting cache profiling information in multi-pass simulator.

Advantageous Effects of Invention

According to an embodiment, the present invention provides correcting cache profiling information in multi-pass simulator.

BRIEF DESCRIPTION OF DRAWINGS

These and/or other aspects will become apparent and more readily appreciated from the following description of the embodiments, taken in conjunction with the accompanying drawings in which:

FIG. 1 is a flowchart illustrating a method of correcting cache profiling information in a multi-pass simulator according to an embodiment of the present invention;

FIG. 2A is a flowchart illustrating a method of correcting cache profiling information in a multi-pass simulator according to an embodiment of the present invention;

FIG. 2B is a flowchart illustrating a method of correcting cache profiling information in a multi-pass simulator according to an embodiment of the present invention;

FIG. 2C is a flowchart illustrating a method of correcting cache profiling information in a multi-pass simulator according to an embodiment of the present invention;

FIG. 3 is a diagram illustrating a method of correcting cache profiling information in a multi-pass simulator according to an embodiment of the present invention;

FIG. 4A is a diagram illustrating a method of correcting cache profiling information in a multi-pass simulator according to another embodiment of the present invention;

FIG. 4B is a diagram illustrating a method of correcting cache profiling information in a multi-pass simulator according to another embodiment of the present invention;

FIG. 4C is a diagram illustrating a method of correcting cache profiling information in a multi-pass simulator according to another embodiment of the present invention;

FIG. 4D is a diagram illustrating a method of correcting cache profiling information in a multi-pass simulator according to another embodiment of the present invention;

FIG. 4E is a diagram illustrating a method of correcting cache profiling information in a multi-pass simulator according to another embodiment of the present invention;

FIG. 4F is a diagram illustrating a method of correcting cache profiling information in a multi-pass simulator according to another embodiment of the present invention;

FIG. 4G is a diagram illustrating a method of correcting cache profiling information in a multi-pass simulator according to another embodiment of the present invention;

FIG. 4H is a diagram illustrating a method of correcting cache profiling information in a multi-pass simulator according to another embodiment of the present invention; and FIG. 5 is a diagram illustrating an apparatus for correcting cache profiling information in a multi-pass simulator.

BEST MODE FOR CARRYING OUT THE INVENTION

One or more embodiments of the present invention include a method and apparatus for correcting cache profiling information in a multi-pass simulator in order to accurately show cache hit and miss information based on a simulation history in a cycle accurate simulator and to obtain accurate cache profiling information.

Additional aspects will be set forth in part in the description which follows and, in part, will be apparent from the description, or may be learned by practice of the presented embodiments.

According to one or more embodiments of the present invention, a method of correcting cache profiling information includes storing a first cache snap shot including cache profiling information regarding a cache when a first process being executed by a cycle accurate simulator is terminated; storing a second cache snap shot including the cache profiling information on the cache when a second process is executed in the cycle accurate simulator; comparing the second cache snap shot of the second process and the first cache snap shot of the first process to readjust any one value of a cache hit value and a cache miss value which are present in the second cache snap shot of the second process; and correcting the cache profiling information which is stored in the first cache snap shot of the first process by reflecting the readjusted any one value of the cache hit value and the cache miss value present in the second cache snap shot of the second process.

The storing of the second cache snap shot may include, when a cold miss occurs in the cache when executing the second process, storing the second cache snap shot.

The storing of the second cache snap shot may include, when the second process is executed, storing the second cache snap shot according to a number of ways in the cache.

The cache miss value which is present in the second cache snap shot of the second process may include any one of a cold miss and a conflict miss.

The storing of the first cache snap shot may further include storing, in the first cache snap shot, information indicating which data is first changed among data stored in a first cache.

The information indicating which data is first changed may be obtained using any one cache data replacement method of a least recently used (LRU) method, a first-in first-out (FIFO) method, a least frequently used (LFU) method, and a random method.

The storing of the second cache snap shot may further include storing, in the second cache snap shot, information indicating which data is first changed among data stored in a second cache.

The information indicating which data is first changed may be obtained using any one cache data replacement method of a least recently used (LRU) method, a first-in first-out (FIFO) method, a least frequently used (LFU) method, and a random method.

In the correcting of the cache profiling information, the stored cache profiling information may be corrected using any one cache data replacement method of a least recently used (LRU) method, a first-in first-out (FIFO) method, a least frequently used (LFU) method, and a random method.

According to one or more embodiments of the present invention, an apparatus for correcting cache profiling information includes a first cache snap shot storage unit for storing a first cache snap shot including cache profiling information on a cache when a first process being executed by a cycle accurate simulator is terminated; a second cache snap shot storage unit for storing a second cache snap shot including the cache profiling information on the cache when a second process is executed in the cycle accurate simulator; an readjustment unit for comparing the second cache snap shot of the second process and the first cache snap shot of the first process to readjust any one value of a cache hit value and a cache miss value which are present in the second cache snap shot of the second process; and a correction unit for correcting the cache profiling information which is stored in the first cache snap shot of the first process by reflecting the readjusted values which are present in the second cache snap shot of the second process.

The second cache snap shot storage unit may store the second cache snap shot when a cold miss occurs in the cache when executing the second process.

When the second process is executed, the second cache snap shot storage unit may store the second cache snap shot according to a number of ways in the cache.

The cache miss value which is present in the second cache snap shot of the second process may include any one of a cold miss and a conflict miss.

The first cache snap shot storage unit may store, in the first cache snap shot, information indicating which data is first changed among data stored in a first cache.

The information indicating which data is first changed may be obtained using any one cache data replacement method of a least recently used (LRU) method, a first-in first-out (FIFO) method, a least frequently used (LFU) method, and a random method.

The second cache snap shot storage unit may store, in the second cache snap shot, information indicating which data is first changed among data stored in a second cache.

The information indicating which data is first changed may be obtained using any one cache data replacement method of a least recently used (LRU) method, a first-in first-out (FIFO) method, a least frequently used (LFU) method, and a random method.

The correction unit may correct the stored cache profiling information using any one cache data replacement method of a least recently used (LRU) method, a first-in firstout (FIFO) method, a least frequently used (LFU) method, and a random method.

Meanwhile, according to one or more embodiments of the present invention, provided is a computer readable recording medium having embodied thereon a computer program for executing the above-described method.

The apparatus may further include a transmission unit that transmits the searched for predetermined frame to another device.

The image capture button may be provided in any one of a digital camera, a cell phone that has a camera function, and a remote controller of a TV that has an image capturing function.

The recognition unit may accurately recognize the movement of the object by using a user's movement pattern.

According to one or more embodiments a computer-readable recording medium may have embodied thereon a program for executing the method.

MODE FOR THE INVENTION

Hereinafter, the inventive concept will be described more fully with reference to the accompanying drawings, in which exemplary embodiments of the invention are shown. The inventive concept may, however, be embodied in many different forms and should not be construed as limited to the exemplary embodiments set forth herein. Rather, these embodiments are provided so that this disclosure will be thorough and complete, and will fully convey the scope of the invention to those of ordinary skilled in the art. Similar elements are denoted by similar reference numerals throughout.

The present invention will now be described more fully with reference to the accompanying drawings, in which exemplary embodiments of the invention are shown.

Terms used hereinafter are used considering the functions in the present invention and may be changed according to a user's or operator's intention, usual practice, or development of new technology. Also, some terms may be arbitrarily selected by the applicant, and in this case, the meaning of the terms will be explained in detail. Accordingly, the terms will be defined based on the entire content of the description of the present invention.

Unless otherwise noted, the term "comprise" or variations such as "comprises" or "comprising" is understood to mean "includes, but is not limited to" so that other elements that are not explicitly mentioned may also be included. Also, the term "unit" may be configured as software, or may be configured as hardware, such as FPGA or ASIC. However, the term "unit" may be configured to be included in a storage medium capable of being addressed, or may be configured to reproduce one or more processors.

Therefore, the term "unit" as an example includes components such as software components, object-oriented software components, class components, and task components, processes, functions, properties, procedures, subroutines, segments of a program code, drivers, firmware, microcodes, circuits, data, a database, data structures, tables, arrays, and variables. Functions provided within the components and the "unit" may be combined with a less number of components and "units", or may be divided into additional components and "units".

Hereinafter, the present invention will be described more fully with reference to the accompanying drawings, in which exemplary embodiments of the invention are shown. The invention may, however, be embodied in many different forms and should not be construed as being limited to the embodiments set forth herein. When publicly known techniques or structures related to the present invention may unnecessarily make the present invention unclear, the detailed description will be omitted.

The term "simulator" used herein refers to a simulator for testing an application in which hardware is realized by software in order to develop the application before developing the hardware. The simulator may include an instruction set only simulator and a cycle accurate simulator.

In the instruction set only simulator, the simulation is executed in units of commands, and thus an execution speed may be increased. However, in a case in which an application is realized by hardware, the realization is made in units of cycles, and various apparatuses processing commands are not considered, and thus simulation information regarding the entire system is not sufficient.

In the cycle accurate simulator, the simulation is executed in units of cycles, and thus more accurate and a greater amount of system information can be obtained than that obtained in the instruction set only simulator. However, since the execution is in units of cycles, one command is executed over a plurality of cycles, and thus the execution speed is lower than that in the instruction set only simulator.

Another simulator is a distributed multi-pass simulator. In the distributed multi-pass simulator, the simulation is divided into two passes to be executed. In a first pass, a snap shot is generated and stored, the first pass being executed at a high speed by an instruction set only simulator which stores system information at regular time intervals. In a second pass, a maximum simulation process is generated through a cycle accurate simulator and the snap shot generated at the time when the first pass simulation is executed is received as an input.

In the distributed multi-pass simulator, a snap shot of the first pass simulation shows system information at the time corresponding to when the snap shot was taken, but may not show history information (for example, a cache hit or a cache miss) based on a previous process to a user. This is because there is no information stored on a cache when processes are first started in the second pass simulation.

In the distributed multi-pass simulator, when a large amount of processes are generated in order to increase execution speed of a simulation, the amount of erroneous cache profiling information increases, and thus more serious errors may occur when a user analyzes a system.

In this specification, the term "cache" refers to a memory that is used to improve a difference in speed between a microprocessor and a main memory. Since the speed of the main memory is much lower than that of the microprocessor, if the microprocessor reads all pieces of data from the main memory, the performance of the microprocessor greatly decreases. In order to reduce such a decrease in performance, pieces of data (including commands) which are frequently used in a program are read from the main memory and are stored in a cache, and then the microprocessor reads the pieces of data from the cache instead of from the main memory, and thus an increased system performance is obtained. In order to load data to be read by the microprocessor from the cache instead of from the main memory, the corresponding data has to be loaded to the cache in advance. For this, only when it is predicted what data is to be referred to by the microprocessor, the data may be loaded in advance to the cache from the main memory.

In general, when a program is executed, there is a high possibility that a recently used instruction and data are to be used again. The execution of a program is accompanied by a principle of locality. The locality is classified into two types of locality, that is, temporal locality and spatial locality. The temporal locality indicates that there is a high possibility that recently-used data is to be used again in a short period of time. The spatial locality indicates that there is a high possibility that pieces of data within a close address region are to be accessed with a short time difference with respect to one another.

The cache may predict an instruction and data to be referred to by the microprocessor on the basis of the type of locality. When the microprocessor loads data, there is a high possibility that data around the corresponding data may be referred to again within a short period of time on the basis of locality.

Based on such spatial locality, when the cache loads data, the cache loads data around the corresponding data together. At this time, when the cache loads data, a unit of loaded data is referred to as a cache block or a cache line.

A case where data required by the microprocessor is already loaded in the cache is referred to as a "cache hit", and a case where data is not already loaded in the cache is referred to as a "cache miss".

In a case of the cache hit, data that is present in a cache block may be loaded to a cache.

In a case of the cache miss, data is loaded from a main memory to a cache. When the cache is filled with other pieces of data, one of the cache blocks is selected as a victim block, and the victim block is replaced with a corresponding block of the main memory. The block replacement may also be referred to as cache replacement. The block replacement means that data of the victim block is stored in a main memory and data of the main memory is loaded to the cache.

The cache miss may include a cold miss and a conflict miss.

The cold miss is a cache miss occurring in a case where data is required by the microprocessor but no data is present in the cache block.

The conflict miss is a cache miss occurring in a case where data is present in the cache block but the microprocessor requires data different from the data stored in the cache block.

FIG. 1 is a flowchart illustrating a method of correcting cache profiling information by a multi-pass simulator according to an embodiment of the present invention.

In Operation 100, when a first process being executed in a cycle accurate simulator is terminated, a first cache snap shot including profiling information on a cache is stored.

The profiling information on the cache of the first cache snap shot may include data stored in the cache and the position of the stored data within the cache.

The first cache snap shot may store information indicating which information indicating which data of the data stored in a first cache is first changed. The information may include information indicating which one is a victim cache in the data stored in a cache block.

The information indicating which data is first changed may be obtained using any one cache data replacement method of a least recently used (LRU) method, a first-in first-out (FIFO) method, a least frequently used (LFU) method, and a random method.

The LRU method is a method in which least frequently used data is first replaced with other data. The FIFO method is a method in which data that is first stored in a cache is first replaced with other data. The LFU method is a method in which the frequency of use for each data is stored and least frequently used data is first replaced with other data. The random method is a method in which data is randomly selected from data stored in a cache and the randomly selected data is replaced with other data.

In Operation 110, when a second process is executed in the cycle accurate simulator, a second cache snap shot including profiling information of the cache is stored.

When a cold miss occurs in the cache when executing the second process, the second cache snap shot may be stored. In addition, when the second process is executed, the second cache snap shot may be stored according to the number of ways in the cache. The way of the cache is determined according to the number of cache block units which constitute one set in the cache.

The second cache snap shot may store information indicating which data is first changed among data stored in the second cache.

The information indicating which data is first changed may be obtained using any one cache data replacement method of an LRU method, a FIFO method, an LFU method, and a random method.

In Operation 120, the second cache snap shot of the second process is compared with the first cache snap shot of the first process to readjust values of the cache hit and the cache miss which are present in the second cache snap shot of the second process.

The cache miss may include a cold miss and a conflict miss. A simulation of the second process is started in a state where there is no cache information, and thus the simulation of the second process may be different from a simulation started in a state where cache information is already stored in a final first cache snap shot of the first process. Accordingly, a cache hit or a cache miss may be determined based on such a difference. At this time, values of the first cache snap shot of the first process and the second cache snap shot of the second process may be compared with each other and readjusted.

In Operation 130, the readjusted value of the second cache snap shot of the second process is reflected to correct the cache profiling information stored in the first cache snap shot of the first process.

The stored cache profiling information may be corrected using any one cache data replacement method of an LRU method, a FIFO method, an LFU method, and a random method.

FIG. 2A is a flowchart illustrating a method of correcting cache profiling information in a multi-pass simulator according to an embodiment of the present invention.

A first process may mean an (n−1)-th process, and a second process may mean an nth process. Here, n may be an integer equal to or greater than 2.

In the following description, a second cache snap shot is stored in a case of a cold miss during the execution of the simulation of the second process.

FIG. 2A is a flowchart illustrating when a simulation of a first process of a cycle accurate simulator is started (Operation 200) and until when the simulation is terminated (Operation 215).

In Operation 200, the simulation of the first process is started.

In Operation 205, it is determined whether a part of the simulation that is currently being executed after Operation 200 is a final part of the simulation.

In Operation 210, when it is determined in Operation 205 that the part of the simulation is the final part of the simulation, a first cache snap shot of the first process is stored. The snap shot may store cache profiling information.

When it is determined in Operation 205 that the part is not the final part of the simulation, the simulation continues.

In Operation 215, the simulation of the first process is terminated after the first cache snap shot is stored.

FIG. 2B is a flowchart illustrating a method of correcting cache profiling information in a multi-pass simulator according to an embodiment of the present invention.

FIG. 2B is a flowchart illustrating when detection is started for determining whether a cold miss has occurred following the start of a simulation of a second process of the cycle accurate simulator (Operation 220) until when the detection is terminated (Operation 240).

According to the sequence of the cycle accurate simulator, the simulation of the second process is started after the simulation of the first process is terminated.

That is, after the simulation of the first process is terminated in FIG. 2A, the simulation of the second process is started in FIG. 2B.

In Operation 220, detection is started for determining whether a cold miss has occurred during the simulation of the second process.

In Operation 225, it is determined whether a cold miss has occurred during the simulation of the second process.

When it is determined in Operation 225 that a cold miss has not occurred, the detection is continued until a cold miss occurs.

In Operation 230, when it is determined in Operation 225 that a cold miss has occurred during the simulation of the second process, a second cache snap shot for a cache of the second process is stored. The second cache snap shot is a snap shot that is stored in a case of a cold miss, and refers to a second cache snap shot of the second process.

After the second cache snap shot is stored in Operation 230, it is determined in Operation 235 whether the number of second cache snap shots stored is equal to the number of ways in the cache.

Since the second process has no information regarding a cache in the first process, the number of empty spaces in the cache block is equal to the number of ways in the cache.

Since the cold miss occurs when the microprocessor requires data from the cache but the cache has empty spaces, the second cache snap shot is generated according to the number of ways.

When it is determined in Operation 235 that the number of second cache snap shots stored is not equal to the number of ways in the cache, detection of the cold miss is continued.

When it is determined in Operation 235 that the number of second cache snap shots stored is equal to the number of ways in the cache, the detection of the cold miss is terminated in Operation 240.

FIG. 2C is a flowchart illustrating a method of correcting cache profiling information in a multi-pass simulator according to an embodiment of the present invention.

After the simulation of the second process is terminated, the following operations are performed using the snap shot stored in the first process.

After the simulation of the second process is terminated, an operation of correcting cache profiling information stored in the snap shot is started in Operation 245.

In Operation 250, a value of the cache snap shot of the first process is compared with a value of the second cache snap shot of the second process.

In Operation 255, profiling information of the first cache snap shot of the first process is corrected.

In Operation 260, it is determined whether the second process is a final process of the cycle accurate simulation.

When it is determined that the second process is a final process, the method proceeds to Operation 265 and completes the correction of profiling information. When the second process is not a final process, processes which are respectively subsequent to the first process and the second process are performed. Then, the first cache snap shot of the first process and the second cache snap shot of the second process are compared with each other.

FIG. 3 is a diagram illustrating a method of correcting a value of a cache hit or a cache miss in a multi-pass simulator according to an embodiment of the present invention.

FIG. 3 illustrates a method of readjusting a value of a cache hit or a cache miss when the number of ways in a cache is one (for example, a direct mapped cache).

When both a first cache snap shot of a first process and a second cache snap shot of a second process have no data (300), correction is unnecessary.

When the first cache snap shot of the first process has no data and the second cache snap shot of the second process has data (310), the value of the cache hit or the cache miss of the second cache snap shot of the second process is corrected to a cold miss.

When the first cache snap shot of the first process has data and the second cache snap shot of the second process has no data (320), data that is present in the first cache snap shot of the first process is copied to the second cache snap shot of the second process to correct cache profiling information.

This is for the purpose of correcting the following defect that, in spite of data being originally present in the first process, the second process starts with a state in which no data is present due to no cache information at the time of starting the second process.

A case where both the first cache snap shot of the first process and the second cache snap shot of the second process have data (330) is classified into two types of cases.

When the data present in the first cache snap shot of the first process is the same as the data present in the second cache snap shot of the second process, information of the cache hit or the cache miss of the second process is corrected to a hit. This is because a cache hit occurs when the microprocessor calls data that is the same as the data stored in the cache.

When the data present in the first cache snap shot of the first process is different from the data present in the second cache snap shot of the second process, information of the cache hit or the cache miss of the second process is corrected to a conflict miss.

This is because a conflict miss occurs when the microprocessor calls data that is different from the data stored in the cache.

FIG. 4A is a diagram illustrating a method of correcting cache profiling information in a multi-pass simulator according to another embodiment of the present invention.

Referring to FIG. 4A, a 4-way set associative cache is used as a cache. Accordingly, one set in the cache has four blocks, and thus four pieces of data are stored.

Referring to cache information that is present in a first cache snap shot of a first process, data "E" is stored in a first cache block 410, data "F" is stored in a second cache block 420, data "A" is stored in a third cache block 430, and data is not stored in a fourth cache block 440.

Referring to values stored in a second cache snap shot of a second process, when pieces of data "G", "A", "B", and "E" are called, a cold miss occurs.

It is assumed that an LRU method is used as a cache replacement method. The LRU method is a method in which earliest used data is replaced first and most recently used data is replaced last.

As another embodiment, a FIFO method may be used as the cache replacement method. The FIFO method is a method in which data that is first stored in a cache is first among data stored in the cache to be replaced with other data.

As another embodiment, a random method may be used as the cache replacement method. The random method is a method in which data is randomly selected from data stored in a cache and the randomly selected data is replaced with other data.

FIG. 4B is a diagram illustrating a method of correcting cache profiling information in a multi-pass simulator according to another embodiment of the present invention.

In FIG. 4B, referring to a first one of the second cache snap shots stored when a cold miss occurs in the second process, when the data "G" is called, the data "G" is stored in a first cache block 460 of the second process, and data is not stored in other cache blocks.

Referring to a second one of the second cache snap shots, when the data "A" is called, the data "G" is stored in the first cache block 460 of the second process, the data "A" is stored in a second cache block 470, and data is not stored in other cache blocks.

Referring to a third one of the second cache snap shots, when data "B" is called, the data "A" is stored in the first cache block 460 of the second process, the data "G" is stored in the second cache block 470, the data "B" is stored in a third cache block 480, and data is not stored in a fourth cache block 490.

Referring to a fourth one of the second cache snap shots, when data "E" is called, the data "B" is stored in the first cache block 460, the data "A" is stored in the second cache block 470, the data "G" is stored in the third cache block 480, and the data "E" is stored in the fourth cache block 490.

FIG. 4C is a diagram illustrating a method of correcting cache profiling information in a multi-pass simulator according to another embodiment of the present invention.

Referring to the first one of the second cache snap shots of the second process, the data "G" is called, but the fourth cache block 440 is empty in the first process, and the data "G" is not stored in other cache blocks. Accordingly, when values of the second process and the first process are compared with each other, a cache hit or a cache miss in the second process is determined to be a cold miss. The data "G" is stored in the fourth cache block 440 of the first process based on cache information of the second cache snap shot of the second process and the value of the readjusted cold miss.

FIG. 4D is a diagram illustrating a method of correcting cache profiling information in a multi-pass simulator according to another embodiment of the present invention.

The data "A" is called in the second process, and since the data "A" is stored in the third cache block 430 of the first cache snap shot of the first process, a cache hit or a cache miss of the second process is thus readjusted to a cache hit.

FIG. 4E is a diagram illustrating a method of correcting cache profiling information in a multi-pass simulator according to another embodiment of the present invention.

Since the data "A" is called in FIG. 4D, the cache is replaced in FIG. 4E using the LRU method. Thus, FIG. 4E illustrates that the data "A", which was most recently used in the first process, is replaced with the fourth cache block 440 from the third cache block 430 and the data "G" stored in the fourth cache block 440 of the first process is replaced with the third cache block 430.

FIG. 4F is a diagram illustrating a method of correcting cache profiling information in a multi-pass simulator according to another embodiment of the present invention.

The data "B" is called in a second process. Accordingly, referring to the first cache snap shot of the first process, the data "B" is not stored, and other pieces of data are stored in all the cache blocks. Thus, a cache hit or a cache miss of the third one of the second cache snap shots of the second process is readjusted to a conflict miss.

In a case of a conflict miss, one of the pieces of data stored in the cache is deleted, and data as a target of the conflict miss is stored the cache.

Referring to the cache profiling information of the first cache snap shot of the first process, since the data "E" is the earliest called data and is thus located in the first cache block 410, the data "E" is deleted by the LRU method. The data "F" used following the deletion of the data "E" is replaced with the first cache block 410. According to the third one of the second cache snap shots of the second process, the data "B" is most recently called, and then the data "G" and the data "A" are called in this order. The cache profiling information of the first cache snap shot of the first process is corrected in accordance with the order in which the data "G" and the data "A" are called. The data "F" is maintained in the first cache block 410 as-is, and the cache profiling information of the first cache snap shot of the first process is corrected in such a manner that the data "A" is replaced with data of the second cache block 420, the data "G" is replaced with data of the third cache block 430, and the data "B" is replaced with data of the fourth cache block 440.

FIG. 4G is a diagram illustrating a method of correcting cache profiling information in a multi-pass simulator according to another embodiment of the present invention.

Comparing the fourth one of the second cache snap shots of the second process and the first cache snap shot of the first process, the data "E" is called, but the data "E" is not currently stored in the cache profiling information of the first cache snap shot of the first process.

However, since other pieces of data are stored in all the cache blocks, a cache hit or a cache miss of the second process is readjusted to a conflict miss.

FIG. 4H is a diagram illustrating a method of correcting cache profiling information in a multi-pass simulator according to another embodiment of the present invention.

Referring to the cache information through the first cache snap shot of the first process, the data "E" is not currently stored in the cache, and thus the data "F", which is the earliest called data, is deleted. Then, the cache profiling information of the first cache snap shot of the first process is corrected in the order in which the data "B", "A", "G" and "E" are stored in the cache block of the fourth one of the second cache snap shots of the second process.

FIG. 5 is a diagram illustrating an apparatus for correcting cache profiling information in a multi-pass simulator.

An apparatus 500 for correcting cache profiling information in a multi-pass simulator may include a first cache snap shot storage unit 510, a second cache snap shot storage unit 520, a readjustment unit 530, and a correction unit 540.

When a first process is finished, the first cache snap shot storage unit 510 may store a first cache snap shot including profiling information regarding a cache.

When a second process is executed, the second cache snap shot storage unit 520 may store a second cache snap shot including profiling information on a cache.

The readjustment unit 530 may compare the second cache snap shot of the second process and the first cache snap shot of the first process and may readjust values of a cache hit and a cache miss which are present in the second cache snap shot of the second process.

The correction unit 540 may correct the cache profiling information stored in the first cache snap shot of the first process such that the readjusted values which are present in the second cache snap shot of the second process are reflected in the cache profiling information stored in the first cache snap shot.

The present invention can also be embodied as computer readable codes on a computer readable recording medium. The computer readable recording medium is any data storage device that can store data which can be thereafter read by a computer system.

Examples of the computer readable recording medium include read-only memory (ROM), random-access memory (RAM), CD-ROMs, magnetic tapes, floppy disks, optical data storage devices, and etc. The computer readable recording medium can also be distributed over network coupled computer systems so that the computer readable code is stored and executed in a distributed fashion.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

The invention claimed is:

1. A method of correcting cache profiling information, the method comprising:
   storing a first cache snap shot comprising cache profiling information regarding a cache when a first process being executed by a cycle accurate simulator is terminated;
   storing a second cache snap shot comprising the cache profiling information on the cache when a second process is executed in the cycle accurate simulator;
   comparing the second cache snap shot of the second process and the first cache snap shot of the first process to readjust any one value of a cache hit value and a cache miss value which are present in the second cache snap shot of the second process; and
   correcting the cache profiling information which is stored in the first cache snap shot of the first process by reflecting the readjusted any one value of the cache hit value and the cache miss value present in the second cache snap shot of the second process.

2. The method of claim 1, wherein the storing of the second cache snap shot comprises, when a cold miss occurs in the cache when executing the second process, storing the second cache snap shot.

3. The method of claim 2, wherein the storing of the second cache snap shot comprises, when the second process is executed, storing the second cache snap shot according to a number of ways in the cache.

4. The method of claim 1, wherein the cache miss value which is present in the second cache snap shot of the second process comprises any one of a cold miss and a conflict miss.

5. The method of claim 1, wherein the storing of the first cache snap shot further comprises storing, in the first cache snap shot, information indicating which data is first changed among data stored in a first cache.

6. The method of claim 5, wherein the information indicating which data is first changed is obtained using any one cache data replacement method of a least recently used (LRU) method, a first-in first-out (FIFO) method, a least frequently used (LFU) method, and a random method.

7. The method of claim 5, wherein the storing of the second cache snap shot further comprises storing, in the second cache snap shot, information indicating which data is first changed among data stored in a second cache.

8. The method of claim 7, wherein the information indicating which data is first changed is obtained using any one cache data replacement method of a least recently used (LRU) method, a first-in first-out (FIFO) method, a least frequently used (LFU) method, and a random method.

9. The method of claim 1, wherein in the correcting of the cache profiling information, the stored cache profiling information is corrected using any one cache data replacement method of a least recently used (LRU) method, a first-in first-out (FIFO) method, a least frequently used (LFU) method, and a random method.

10. An apparatus for correcting cache profiling information, the apparatus comprising:
   a first cache snap shot storage unit for storing a first cache snap shot comprising cache profiling information on a cache when a first process being executed by a cycle accurate simulator is terminated;
   a second cache snap shot storage unit for storing a second cache snap shot comprising the cache profiling information on the cache when a second process is executed in the cycle accurate simulator;
   an readjustment unit for comparing the second cache snap shot of the second process and the first cache snap shot of the first process to readjust any one value of a cache hit value and a cache miss value which are present in the second cache snap shot of the second process; and
   a correction unit for correcting the cache profiling information which is stored in the first cache snap shot of the first process by reflecting the readjusted values which are present in the second cache snap shot of the second process.

11. The apparatus of claim 10, wherein the second cache snap shot storage unit stores the second cache snap shot when a cold miss occurs in the cache when executing the second process.

12. The apparatus of claim 11, wherein when the second process is executed, the second cache snap shot storage unit stores the second cache snap shot according to a number of ways in the cache.

13. The apparatus of claim 10, wherein the cache miss value which is present in the second cache snap shot of the second process comprises any one of a cold miss and a conflict miss.

14. The apparatus of claim 10, wherein the first cache snap shot storage unit stores, in the first cache snap shot, information indicating which data is first changed among data stored in a first cache.

15. The apparatus of claim 14, wherein the information indicating which data is first changed is obtained using any one cache data replacement method of a least recently used (LRU) method, a first-in first-out (FIFO) method, a least frequently used (LFU) method, and a random method.

16. The apparatus of claim 14, wherein the second cache snap shot storage unit stores, in the second cache snap shot, information indicating which data is first changed among data stored in a second cache.

17. The apparatus of claim 16, wherein the information indicating which data is first changed is obtained using any one cache data replacement method of a least recently used (LRU) method, a first-in first-out (FIFO) method, a least frequently used (LFU) method, and a random method.

18. The apparatus of claim 10, wherein the correction unit corrects the stored cache profiling information using any one cache data replacement method of a least recently used (LRU) method, a first-in first-out (FIFO) method, a least frequently used (LFU) method, and a random method.

* * * * *